(12) United States Patent
Takeichi et al.

(10) Patent No.: US 6,531,026 B1
(45) Date of Patent: Mar. 11, 2003

(54) METHOD FOR MOUNTING ELECTRONIC ELEMENTS

(75) Inventors: Motohide Takeichi, Kanuma (JP); Yukio Yamada, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 47 days.

(21) Appl. No.: 09/585,415

(22) Filed: Jun. 2, 2000

(30) Foreign Application Priority Data

Jun. 23, 1999 (JP) .......................................... 11-177230

(51) Int. Cl.[7] .............................................. B32B 31/00
(52) U.S. Cl. ...................... 156/282; 29/832; 156/152; 156/315
(58) Field of Search ................................ 156/152, 282, 156/315; 29/832

(56) References Cited

U.S. PATENT DOCUMENTS 2,401,987 A * 6/1946 Taylor et al. ................ 156/282
5,261,156 A * 11/1993 Mase et al. .................... 29/832
6,139,661 A * 10/2000 Cronin et al. .................. 29/832

FOREIGN PATENT DOCUMENTS

| JP | 09/162235 | 6/1997 |
| JP | 2000-323348 | 11/2000 |

\* cited by examiner

*Primary Examiner*—John J. Gallagher
(74) *Attorney, Agent, or Firm*—Oliff & Berridge, PLC

(57) ABSTRACT

A method for mounting electronic elements, comprises the step of arranging a thermosetting adhesive between a circuit board, situated on a stage, and an electronic element to be connected with the wiring pattern of the circuit board, and then bonding the electronic element to the circuit board by the application of heat and pressure from the electronic element side. The electronic element is temporarily thermocompression-bonded to the circuit board such that the thermosetting reaction rate of the thermosetting adhesive on the side of the circuit board is lower than the thermosetting reaction rate on the side of the electronic element. The thermosetting adhesive is then set finally in order to bond the electronic element to the circuit board.

17 Claims, 1 Drawing Sheet

METHOD FOR MOUNTING ELECTRONIC ELEMENTS

BACKGROUND OF THE INVENTION

1. Field of the Invention

The present invention relates to a method for mounting electronic elements, such as IC chips, over the wiring pattern on a circuit board (for example, a multichip module circuit board) by bonding the electronic elements thereto using a thermosetting adhesive such as an anisotropic conductive adhesive film.

2. Description of the Related Art

Electronic devices developed in recent years offer higher performance, notwithstanding their lighter weight and smaller, thinner profiles. An associated trend has been a decrease in the area available on the circuit board for mounting the various electronic elements (capacitor elements, resistor elements, IC chips, etc.) used in such electronic devices. Accordingly, electronic element-to-circuit board connections are currently produced by thermocompression-bonding of the connection terminals of the electronic elements to the wiring pattern of the circuit board by means of a thermosetting adhesive (e.g., an anisotropic conductive adhesive, anisotropic conductive adhesive film, insulating adhesive, or insulating adhesive film). In the case of IC chips, an IC chip in bare chip form is mounted through flip-chip joining thereof, using a thermosetting adhesive, to a circuit board (termed an interposer) of substantially the same dimensions as the chip, or a plurality of IC chips are mounted through flip-chip joining, using a thermosetting adhesive, to a multichip module circuit board.

Flip-chip mounting as practiced currently involves arranging the interposer board or multichip module circuit board on a stage, applying a thermosetting adhesive thereover, positioning the IC chip(s) thereon, and then thermocompression-bonding the IC chip(s) to the interposer or multichip module circuit board by a heating tool.

In the process of checking IC chips to determine if any are defective, the extremely fine pitch of the wiring patterns on IC chips makes it difficult to inspect IC chips per se that are as yet unmounted and in a bare chip form. Accordingly, typical practice is to check IC chips for defects after the IC chips have been mounted onto an interposer or multichip module circuit board, by performing a conductivity check on the IC chips via the circuit board.

If the check should reveal an IC chip to be defective, it will be necessary to repair the defective IC chip, since discarding the entire interposer or multichip module circuit board on which the defective IC chip is mounted would push up production costs. Attempts have been made to accomplish this by depressing the reaction rate of the thermosetting adhesive overall during flip-chip mounting so as to allow the IC chip to be peeled away with relatively low shearing force.

However, the approach of depressing the reaction rate of the thermosetting adhesive overall during flip-chip mounting, at least to the extent that the IC chip can be peeled away with relatively low shearing force possess a problem that the cohesive force of the thermosetting adhesive is lower as a result, and conductivity checking cannot be adequately accomplished.

Conversely, raising the reaction rate of the thermosetting adhesive overall in order to enable the conductivity checking will raise the cohesive force of the thermosetting adhesive, and it will make it difficult to repair a defective IC chip.

With the foregoing in view, it is an object of the present invention to solve the problems associated with the prior art by providing a method for mounting electronic elements, whereby both adequate conductivity checking and repair of electronic elements may be achieved during the process of bonding an electronic element, such as an IC chip, over the wiring pattern on a circuit board (for example, a multichip module circuit board) by bonding thereto with a thermosetting adhesive such as an anisotropic conductive adhesive film.

The inventors perfected the present invention based on the discovery that during thermocompression-bonding of an electronic element to a circuit board by means of a thermosetting adhesive, where the electronic element and the circuit board are subjected to a temporary thermocompression-bonding process conducted in such a way that the thermosetting reaction rate of the thermosetting adhesive at the circuit board-bonding face thereof is lower than that at the electronic element-bonding face thereof, (i) the cohesive force of the thermosetting adhesive at the interface between the circuit board and thermosetting adhesive is relatively low, allowing the electronic element to be peeled away from the circuit board with relatively low shearing force, thus making it possible to repair the electronic element; (ii) the cohesive force of the thermosetting adhesive at the interface between the electronic element and thermosetting adhesive, on the other hand, is relatively higher, making conductivity checking possible; and (iii) after completing the conductivity check, the electronic element can be reliably mounted on the circuit board by fully setting the thermosetting adhesive.

SUMMARY OF THE INVENTION

Specifically, the present invention provides a method for mounting electronic elements, comprising the step of arranging a thermosetting adhesive between a circuit board, situated on a stage, and an electronic element to be connected with the wiring pattern of the circuit board, and then bonding the electronic element to the circuit board by the application of heat and pressure to the electronic element-bonding face, wherein the electronic element and the circuit board are subjected to a temporary thermocompression-bonding process conducted in such a way that the thermosetting reaction rate of the thermosetting adhesive at the circuit board-bonding face thereof is lower than reaction rate with thermosetting at the electronic element-bonding face thereof, and the thermosetting adhesive is then set fully in order to bond the electronic element to the circuit board.

DESCRIPTION OF THE PREFERRED EMBODIMENTS

An embodiment of the electronic element mounting method which pertains to the present invention is described in detail hereinbelow with reference to the accompanying drawing.

Figure 1A:
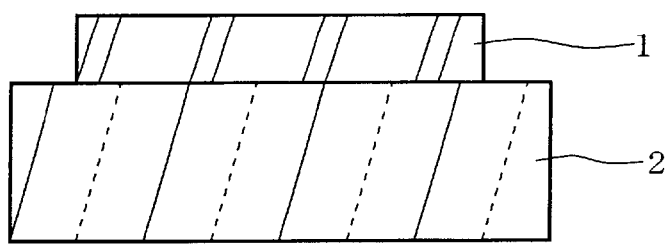
FIGS. 1A to 1D are illustrative diagrams showing the electronic element mounting method which pertains to the present invention.

First, a circuit board 1 having a wiring pattern (not shown) formed on the surface thereof is arranged on a stage 2 (FIG. 1A).

Here, the circuit board 1 can be any of various circuit boards used in mounting electronic components, such as a TAB circuit board, flexible circuit board, CSP circuit board, or multichip module circuit board.

Figure 1B:
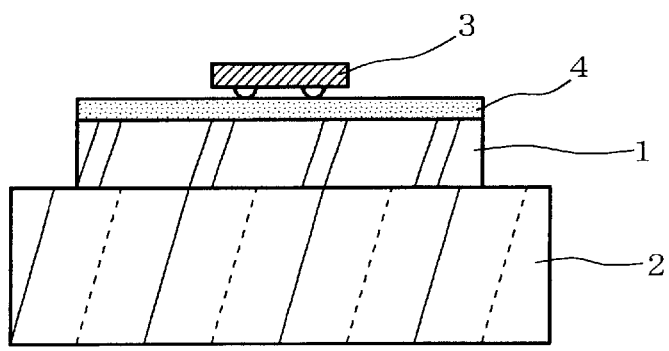

Next, a thermosetting adhesive 4 is arranged between the circuit board 1 and the electronic element 3 to be connected with the wiring pattern (not shown) thereof (FIG. 1B).

Here, electronic element 3 can be a bare IC chip, capacitor element, resistor element, or the like.

Examples of thermosetting adhesive 4 include an anisotropic conductive adhesive paste, an anisotropic conductive adhesive film, an insulating adhesive paste or liquid, and an insulating adhesive film.

Figure 1C:
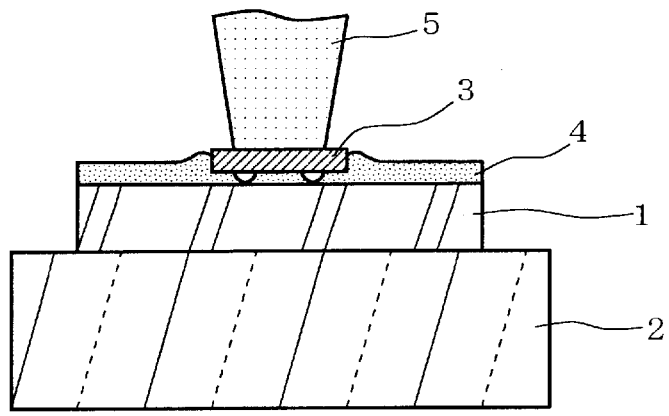

Next, using a heating and compression apparatus 5 known in the art, such as a heat bonder, electronic element 3 is temporarily thermocompression-bonded to circuit board 1, such that the thermosetting reaction rate of thermosetting adhesive 4 on the side of circuit board 1 is lower than the thermosetting reaction rate thereon the side of electronic element 3 (FIG. 1C). More specifically, the temprorary thermocompression-bonding is carried out such that the thermosetting reaction rate of the thermosetting adhesive 4 on the side of the circuit board 1 is from 10 to 50%, and more preferably from 25 to 40%, whereas the thermosetting reaction rate of the thermosetting adhesive 4 on the side of the electronic element 3 is at least 20% higher, and preferably from 30 to 50% higher, than that of thermosetting adhesive 4 on the side of the circuit board. By so doing, the cohesive force of thermosetting adhesive 4 at the interface between the circuit board 1 and the thermosetting adhesive 4 can be made relatively low, allowing the electronic element 3 to be peeled away from the circuit board 1 with relatively low shearing force. Repairing of the electronic element 3 is enabled as a result.

The cohesive force of the thermosetting adhesive 4 at the interface between the electronic element 3 and the thermosetting adhesive 4, on the other hand, is relatively high, whereby conductivity checking via the circuit board 1 is enabled to check the electronic element 3 for defects.

In the present invention, the process for temporarily thermocompression-bonding the electronic element 3 to the circuit board 1 such that the thermosetting reaction rate of the thermosetting adhesive 4 on the side of the circuit board 1 is lower than that on the side of the electronic element 3 can be carried out, for example, by temporarily thermocompression-bonding the electronic element 3 to the circuit board 1 while cooling stage 2 (preferably to a temperature of 10° C. or lower) using a cooling means known in the art (e.g., a compressed air gun or water-cooled pipe). Alternatively, the thermosetting adhesive 4 may be composed of multiple layers, at least one of which may be of different composition eg. by manipulating the composition of the layer closest to the electronic element 3 (for example, by increasing the concentration of the polymerization initiator) so as to increase its reaction rate with thermosetting.

Figure 1D:
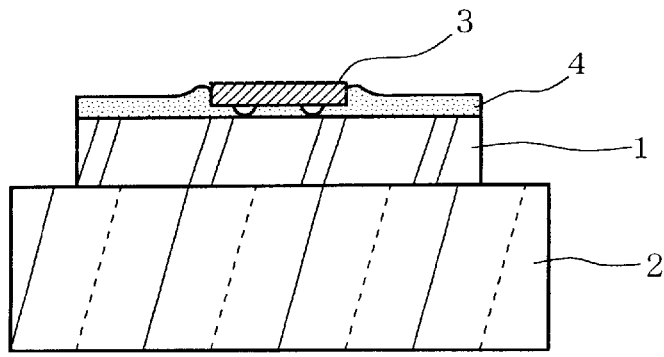

The thermosetting adhesive 4 is then cured finally in order to reliably bond the electronic element 3 to the circuit board 1, whereupon mounting of electronic element 3 onto circuit board 1 is completed (FIG. 1D).

(Final curing of the thermosetting adhesive 4 may be carried out by a process analogous to that used for temporary thermocompression-bonding. Alternatively, after-curing may be carried out in an oven using a batch process.

EXAMPLES

The invention will be described in greater detail hereinbelow by referring the following examples.

Examples 1 to 4, Comparative Examples 1 and 2

A glass-epoxy circuit board GP (flame retardance level= FR5) or an alumina ceramic circuit board AC was arranged on a stainless steel stage for thermocompression-bonding maintained at 0° C. (EXAMPLES 1 to 4) or at 23° C. (COMPARATIVE EXAMPLES 1 and 2) using a commercially available compressed air gun. Over the wiring pattern of the circuit board was arranged either a thermosetting epoxy type anisotropic conductive film A (FP10425, available from Sony Chemical) or an anisotropic conductive film B (FP20626, available from Sony Chemical), and over this was positioned a bare IC chip (Au plated bump pitch=100 µm; Size=6.3 mm×6.3 mm).

The bare IC chip was then temporarily thermocompression-bonded to the circuit board by applying heat and pressure (160° C., 10 seconds) with a heating tool.

During temporary thermocompression-bonding, the thermosetting reaction rate of anisotropic conductive film on the side of the circuit board and the thermosetting reaction rate of anisotropic conductive film on the side of the IC chip were measured; resistivity (mΩ) was also measured by the four-point probe method. Results are given in TABLE 1. The thermosetting reaction rate was determined by comparing FT-IR absorption by epoxy groups and methyl groups with absorption by epoxy groups and methyl groups in an unreacted anisotropic conductive film. For reaction rate measurements, circuit board/anisotropic conductive film/IC chip assembly specimens subjected to temporary thermocompression-bonding were placed under cooling while grinding them from the circuit board-bonding face and from IC chip side in order to expose the anisotropic conductive film interface.

The circuit board onto which an IC chip had been temporarily thermocompression-bonded was then heated on a hot plate (100° C.), applying shearing force to the IC chip to separate it. The shearing force (kgf) required for separation is indicated in TABLE 1.

After removing with acetone any anisotropic conductive film remaining on the circuit board, a repairing IC chip was again temporarily thermocompression-bonded to the circuit board, and resistivity (mΩ) was measured by the four-point probe method. Results are given in TABLE 1.

Finally, the laminate body consisting of the temporarily thermocompression-bonded circuit board, anisotropic conductive film, and repairing IC chip assembly was subjected to after-curing in a 130° C. convection oven to bring about final curing of the anisotropic conductive film to effect reliable mounting of the IC chip to the circuit board. The resultant IC chip mounted circuit board was subjected to a 1000-hour reliability test carried out in an 85° C., 85% RH environment, after which resistivity (mΩ) was again measured. Results are given in TABLE 1.

TABLE 1

|  | EXAMPLE | | | | COM. EXAMPLE | |
| --- | --- | --- | --- | --- | --- | --- |
|  | 1 | 2 | 3 | 4 | 1 | 2 |
| Anisotropic conductive film used | A | A | B | B | A | B |
| Circuit board used | AC | GP | AC | GP | AC | AC |
| Stage temp. (° C.) | 0 | 0 | 0 | 0 | 23 | 23 |
| Thermosetting reactivity of anisotropic conductive film |  |  |  |  |  |  |
| On the side of circuit board (%) | 24 | 34 | 28 | 33 | 85 | 88 |
| On the side of IC chip (%) | 85 | 86 | 76 | 86 | 90 | 90 |
| Resistivity in temporary thermocompression-bonding (mΩ) | 6 | 5 | 6 | 6 | 6 | 5 |
| Shear force at repairing (kgf) | 6.5 | 8.2 | 5.9 | 7.4 | 23*[1] | 31*[1] |

TABLE 1-continued

|  | EXAMPLE | | | | COM. EXAMPLE | |
| --- | --- | --- | --- | --- | --- | --- |
|  | 1 | 2 | 3 | 4 | 1 | 2 |
| Resistivity after repairing (mΩ) | 6 | 6 | 5 | 5 | 6 | 6 |
| Resistivity after reliability test (mΩ) | 8 | 8 | 5 | 7 | 10 | 7 |

*TABLE 1 notes (*1: indicates IC chip broken)

As is apparent from TABLE 1, reducing the reaction rate of the anisotropic conductive film at the circuit board-bonding face thereof by cooling the stage to 0° C. has the effect of reducing the shearing force needed to repair the IC chip relative to the level required in the comparative examples, in which the reaction rate of the anisotropic conductive film overall was 85% or more. Resistivity at temporary thermocompression-bonding can be adjusted to about the same level as in with the comparative examples.

According to the mounting method of the present invention, both adequate conductivity checking and electronic element repairing can be achieved when bonding an electronic element to a circuit board. Accordingly, the mounting method of the invention for mounting an IC chip on a circuit board affords a semiconductor device production process wherein both adequate conductivity checking and electronic element repairing may be achieved.

The disclosure of the specification, claims and drawings of Japanese Patent Application No. 11-177230 filed on Jun. 23, 1999 is herein incorporated by reference.

What is claimed is:

1. A method for mounting an electronic element comprising the step of arranging a thermosetting adhesive between a circuit board arranged on a stage and an electronic element to be connected with the wiring pattern of the circuit board, and then bonding the electronic element to the circuit board by the application of heat and pressure from the side of the electronic element, wherein the electronic element is temporarily thermocompression-bonded to the circuit board such that the thermosetting reaction rate of the thermosetting adhesive on the side of the circuit board is lower than the thermosetting reaction rate on the side of the electronic element, and thereafter the thermosetting adhesive is set finally in order to bond the electronic element to the circuit board.

2. The method for mounting an electronic element according to claim 1, wherein the temporary thermocompression-bonding of the electronic element to the circuit board is carried out while cooling the stage.

3. The method for mounting an electronic element according to claim 1, wherein the thermosetting reaction rate of the thermosetting adhesive on the side of the circuit board during temporary thermocompression-bonding is from 10 to 50%.

4. The method for mounting an electronic element according to claim 1, wherein, during temporary thermocompression-bonding, the thermosetting reaction rate of the thermosetting adhesive on the side of the electronic element is at least 20% greater than the thermosetting reaction rate on the side of the circuit board.

5. The method for mounting an electronic element according to claim 1, wherein the electronic element is an IC chip.

6. A method for manufacturing a semiconductor device, wherein an IC chip is mounted on the circuit board by the mounting method according to claim 5.

7. The method for mounting an electronic element according to claim 2, wherein the thermosetting reaction rate of the thermosetting adhesive on the side of the circuit board during temporary thermocompression-bonding is from 10 to 50%.

8. The method for mounting an electronic element according to claim 2, wherein, during temporary thermocompression-bonding, the thermosetting reaction rate of the thermosetting adhesive on the side of the electronic element is at least 20% greater than the thermosetting reaction rate on the side of the circuit board.

9. The method for mounting an electronic element according to claim 3, wherein, during temporary thermocompression-bonding, the thermosetting reaction rate of the thermosetting adhesive on the side of the electronic element is at least 20% greater than the thermosetting reaction rate on the side of the circuit board.

10. The method for mounting an electronic element according to claim 2, wherein the electronic element is an IC chip.

11. The method for mounting an electronic element according to claim 3, wherein the electronic element is an IC chip.

12. The method for mounting an electronic element according to claim 1, wherein the thermosetting adhesive comprises a plurality of layers, at least two of the plurality of layers having different thermosetting reaction rates.

13. The method for mounting an electronic element according to claim 12, wherein a composition of the thermosetting adhesive in a first one of the plurality of layers at the side of the electronic element is different than a composition of the thermosetting adhesive in a second one of the plurality of layers at the side of the electronic element, such that the thermosetting reaction rate of the thermosetting adhesive at the side of the circuit board is different than the thermosetting reaction rate of the thermosetting adhesive at the side of the electronic element.

14. The method for mounting an electronic element according to claim 1, wherein the thermosetting reaction rate of the thermosetting adhesive at the side of the circuit board is different than the thermosetting reaction rate of the thermosetting adhesive at the side of the electronic element.

15. The method for mounting an electronic element according to claim 14, wherein the thermosetting reaction rate of the thermosetting adhesive changes across the thermosetting adhesive from the side of the circuit board to the side of the electronic element.

16. The method for mounting an electronic element according to claim 1, wherein a composition of the thermosetting adhesive at the side of the circuit board is different than a composition of the thermosetting adhesive at the side of the electronic element, such that the thermosetting reaction rate of the thermosetting adhesive at the side of the circuit board is different than the thermosetting reaction rate of the thermosetting adhesive at the side of the electronic element.

17. The method for mounting an electronic element according to claim 16, wherein the thermosetting reaction rate of the thermosetting adhesive changes across the thermosetting adhesive from the side of the circuit board to the side of the electronic element.

* * * * *